United States Patent [19]

Woo

[11] Patent Number: 4,728,827
[45] Date of Patent: Mar. 1, 1988

[54] STATIC PLA OR ROM CIRCUIT WITH SELF-GENERATED PRECHARGE

[75] Inventor: Ann K. Woo, Cupertino, Calif.

[73] Assignee: Advanced Micro Devices, Inc., Sunnyvale, Calif.

[21] Appl. No.: 937,572

[22] Filed: Dec. 3, 1986

[51] Int. Cl.[4] .......................................... H03K 19/017
[52] U.S. Cl. .................................. 307/481; 307/443; 307/452; 307/453; 307/269; 307/468; 365/233
[58] Field of Search ............... 307/443, 448, 449, 452, 307/453, 468, 469, 480, 481, 548, 554, 562, 577, 579, 584–585, 269, 592, 594, 603, 605; 364/716; 365/203, 233

[56] References Cited

U.S. PATENT DOCUMENTS

| | | | |
|---|---|---|---|
| 4,365,316 | 12/1982 | Iwahashi et al. | 307/448 X |
| 4,398,102 | 8/1983 | Stewart | 307/449 |
| 4,553,045 | 11/1985 | Murotani | 307/443 X |
| 4,563,598 | 1/1986 | Oritani | 307/443 X |
| 4,570,084 | 2/1986 | Griffin et al. | 307/452 |
| 4,645,952 | 2/1987 | van Tran | 307/448 |

OTHER PUBLICATIONS

Grice et al., "Exclusive OR PLA and Array", *IBM T.D.B.*, vol. 23, No. 7B, 12-1980, pp. 3270-3271.
Bilger et al. "Single-Ended Unlocked CMOS Logic", *IBM T.D.B.*, vol. 27, No. 10B, 3-1985, pp. 6012-6013.
Delahanty et al., "PLA Driver with Integral Race Prevention", *IBM T.D.B.*, vol. 19, No. 1, 6-1976, pp. 152-153.

*Primary Examiner*—Stanley D. Miller
*Assistant Examiner*—D. R. Hudspeth
*Attorney, Agent, or Firm*—Patrick T. King; Davis Chin; J. Vincent Tortolano

[57] ABSTRACT

A static PLA circuit includes a logic gate portion, a precharge circuit portion and a feedback circuit portion. The feedback circuit portion is connected between the output of the logic gate portion and the input of the precharge circuit portion. The feedback circuit portion functions to delay the turn-on time of the precharge circuit portion when the output of the logic gate portion is making a high-to-low transition, thereby increasing the speed of the output transition.

14 Claims, 5 Drawing Figures

STATIC PLA OR ROM CIRCUIT WITH SELF-GENERATED PRECHARGE

BACKGROUND OF THE INVENTION

This invention relates generally to logic or memory circuits and more particularly, it relates to a static PLA or HOM circuit with self-generated precharge for generating a faster high-to-low transition on its output than those traditionally available.

As is generally known, a PLA (programmable logic array) or ROM (read-only memory) circuit is used to generate many minterms from a number of input select signals. In MOS technology, it is commonly implemented with an array of N-channel transistors connected in the form of a NOR logic gate. In FIG. 1(a), there is shown an example of a single minterm of a dynamic PLA circuit of the prior art. In FIG. 1(b), there is shown an example of a single minterm of a static PLA circuit of the prior art.

As can be seen in FIG. 1(a), the dynamic PLA circuit 10 includes a NOR logic gate formed of N-channel MOS transistors N1–N4 whose gates are connected to receive respective input select signals S1–54 and a precharge circuit portion consisting of a P-channel MOS transistor P1. The transistor P1 has its source connected to a supply potential VCC, drain connected to the output node 12 of the NOR gate, and gate connected to a precharge control input signal such as a clock signal CLOCK. While the dynamic PLA circuit performs adequately to produce fast transitions at the output node, it suffers from the disadvantage in that of requiring the use of the clock signal to switch on and off the transistor P1. Further, another disadvantage exists since there is required an extra lead connection to an external pin for receiving such a clock signal, thereby increasing manufacturing and software costs.

In order to overcome the disadvantages of the dynamic PLA circuit, there has been attempted heretofore the design of a static PLA circuit which does not require the utilization of a precharge control input signal. However, it does need an N-channel or P-channel MOS transistor, which is always turned on, to function as a pull-up device. One such static PLA circuit 14 is illustrated in the aforementioned FIG. 1(b). Since the P-channel transistor P1 is constantly turned on due to the fact that its gate is connected to a ground potential, this creates another problem when the output node A of the NOR gate is switched from the off-state to the on-state. As a result, there is a discharging of not only the charge previously stored at the output node A but also of the current from the P-channel transistor P1 which is always turned on. Therefore, this has the disadvantage of reducing the speed of the high-to-low transition at the output node A.

It would therefore be desirable to provide an improved static PLA circuit which has a fester high-to-low transition at its output than those of the prior art static PLA circuits. The static PLA circuit of the present invention includes a feedback path connected between the output of the logic gate and the gate of a pull-up device so as to increase substantially the speed of the high-to-low transition at the output node.

SUMMARY OF THE INVENTION

Accordingly, it is a general object of the present invention to provide an improved static PLA circuit which is relatively simple and economical to manufacture and assembly, but yet overcomes the disadvantages of the prior art.

It is an object of the present invention to provide a static PLA circuit with self-generated precharge for generating a faster high-to-low transition on its output than those traditionally available.

It is another object of the present invention to provide a static PLA circuit which includes a feedback circuit portion connected between the output of a logic gate and the gate of a pull-up device so as to increase substantially the speed of the high-to-low transition at the output node.

It is still another object of the present invention to provide a static PLA circuit formed of a logic gate portion, a precharge circuit portion and a feedback circuit portion, the feedback circuit portion generating a delay in the turn-on time of the precharge circuit portion so as to increase the speed of the high-to-low transition at the output of the logic gate portion.

In accordance with these aims and objectives, the present invention is concerned with the provision of a static PLA circuit which includes a NOR logic gate, a precharge MO5 transistor, and a feedback circuit portion. The NOR logic gate is provided with inputs for receiving input select signals and an output. The precharge MOS transistor has one of its main selectrodes connected to a supply potential and its other main electrode connected to the output of the NOR gate. The feedback circuit portion is formed of inverters connected between the output of the NOR gate and the gate of the MOS transistor. The inverters function to provide a delay in the turn-on time of the MOS transistor when the output of the NOR gate is making a high-to-low transition in response to the input select signals.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENTS

Figure 2A:
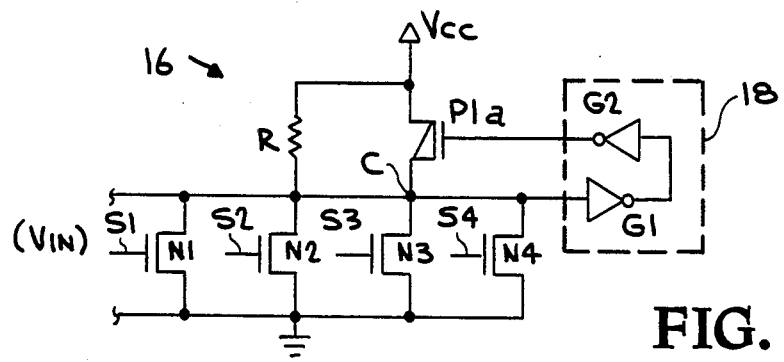
FIG. 2(a) is a schematic diagram of a static PLA circuit of the present invention.

Referring now in detail to the drawings, there is illustrated in FIG. 2(a) a schematic diagram of a static PLA circuit 16 with a single minterm of the present invention. The static PLA circuit 16 includes a logic gate portion, a precharge circuit portion and a feedback circuit portion. The logic gate portion consists of a four-input NOR gate which is formed by N-channel MOS transistors N1 through N4. The drains of the transistors N1–N4 are commonly connected together and to an output node C which is the output of the NOR gate as well as the output of the circuit 16. The sources of the transistors N1–N4 are also commonly connected together and to a ground potential. The gates of the transistors N1–N4 are connected to receive respective input select signals S1, S2, S3 and S4.

It will be noted that the input select signals could be any combination in which S1 or $\overline{S1}$ may be applied to the gate of the transistor N1, S2 or $\overline{S2}$ may be applied to the gate of the transistor N2, S3 or $\overline{S3}$ may be applied to the gate of the transistor N3, and S4 or $\overline{S4}$ may be applied to the gate of the transistor N4. Each of the input select signals S1, $\overline{S1}$ . . . S4 and $\overline{S4}$ may be either at a high (logic "1") or low (logic "0") level. Thus, there are sixteen different combinations of input select signals for a four-input NOR gate. As defined herein, a "minterm" refers to one of these sixteen different combinations of input select signals.

Figure 1A:
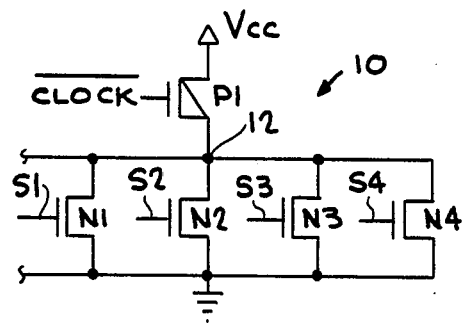
FIG. 1(a) is a dynamic PLA circuit of the prior art.
Figure 1B:
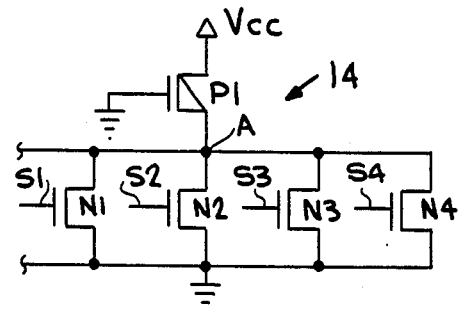
FIG. 1(b) is a static PLA circuit of the prior art.

The precharge circuit portion includes a P-channel MOS transistor P1a functioning as a pull-up device. The transistor P1a has its source connected to a positive supply voltage or potential VCC, which is typically +5 volts, and its drain connected to the output node C. Thus far, the circuit 16 in FIG. 2(a) is identical to the static PLA circuit 14 in FIG. 1(b). Instead of connecting the gate of the transistor P1a to the ground potential, the feedback circuit portion 18 of FIG. 2(a) is connected between the output node C and the gate of the transistor P1a. The feedback circuit portion 18 is formed of a delay means consisting of two inverters G1 and G2 or any even number of inverters. The inverter G1 has its input connected to the output node C and its output connected to the input of the inverter G2. The output of the inverter G2 is connected to the gate of the P-channel transistor P1a. In order to prevent the problem of current leakage at the output node C, a resistor R having a high resistance value has its one end connected to the supply potential VCC and its other end connected to the output node C.

In order to describe the operation of FIG. 2(a), it will be noted that the output node C will be at the high or logic "1" level only when all of the input select signals are at a low level (i.e., S1=0; S2=0; S3=0; and S4=0). If any one of the input select signals is high, then the output node C will be at the low or logic "0" level. Thus, the transistors N1–N4 are indeed connected to operate as a NOR gate. At the outset, it will be assumed that an input select signal $V_{in}$ or S1 applied to the gate of the transistor N1 is at a high level and that the other input select signals S2, S3 and S4 are always low. Accordingly, it will be assumed that the NOR gate is initially turned on such that the output node C is at a low level. Further, it will also be assumed that the P-channel transistor P1 is turned on.

When the input select signal $V_{in}$ switches from the high level to a low level, the NOR gate will be turned off and the voltage $V_C$ at the output node C will go to a high level. As can be seen, the inverters G1 and G2 insert a certain delay time from the output node G to the input of the pull-up device. As a result, the P-channel transistor P1a is maintained in the on-condition for a short time which allows the voltage $V_C$ to rise to the supply potential VCC before the transistor P1a is turned off. Therefore, the circuit 16 will operate in the same manner as the circuit 14 of the FIG. 1(b) since the transistors P1 and P1a are maintained to be turned on in both instances prior to the time when the input select signal is switched from the high level to the low level, thereby producing a very fast low-to-high transition at the respective output nodes A and C via the pull-up transistors P1 and P1a.

When the input select signal $V_{in}$ switches back to the high level, this causes the NOR gate to be turned on again and the voltage $V_C$ at the output node C will be pulled to the low level. Since the pull-up transistor P1a is already in the turned-off condition, the output node C will be able to make a very fast high-to-low transition. This is different from the circuit 14 of FIG. 1(b) in which the transistor P1 is always turned on. Again, it should be apparent that the inverters G1 and G2 add a certain delay time so as to maintain the transistor P1a to be in the off-condition for a short time which allows the voltage $V_C$ to be pulled to the low level before the transistor P1a is turned on.

Figure 3:
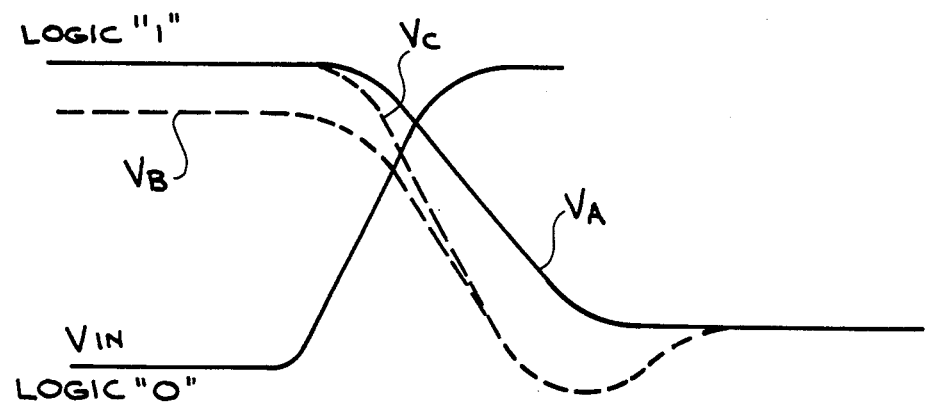
FIG. 3 shows waveforms at the output modes in FIGS. 1(b), 2(a) and 2(b) in response to an input select signal.

Therefore, the circuit 16 will generate a faster high-to-low transistion at its output node C than at the output node A in the circuit 14. The voltage waveforms $V_A$ and $V_C$ at the respective nodes A and C are shown in FIG. 3 in response to the input select signal $V_{in}$ making a low-to-high transition. It has been found that the high-to-low transition at the output node C is substantially improved in which the propagation delay time is reduced from approximately 1.9 ns for the circuit of FIG. 1(a) to approximately 1.2 ns for the circuit of FIG. 2(a).

In other words, the inverters G1 and G2 connected between the output of the NOR gate and the gate of the precharge MOS transistor P1a functions to delay the turn-on time of the transistor P1a when the nutput node C is making a high-to-low transistion in response to the input select signal $V_{in}$ changing from the low level to the high level. Further, the inverters G1 and G2 also functions to delay the turn-off time of the transistor P1a when the output node C is making a low-to-high transistion in response to the input signal $V_{in}$ changing from the high level to the low level.

Figure 2B:
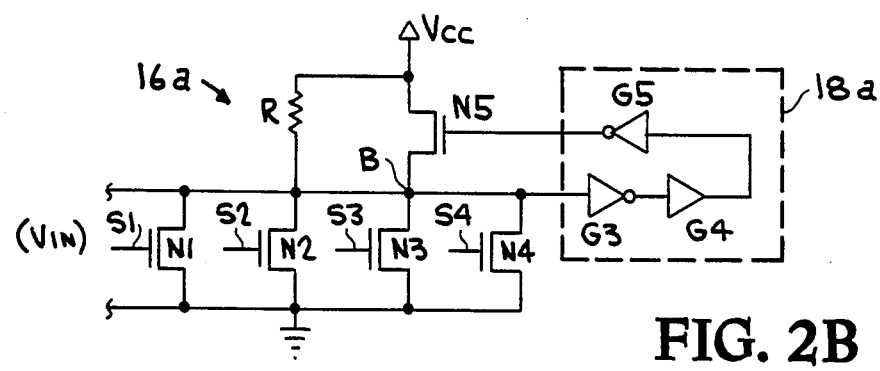
FIG. 2(b) is a schematic diagram of a second embodiment of a static PLA circuit of the present invention.

There is depicted in FIG. 2(b) a second embodiment of a static PLA circuit 16a with a single minterm of the present invention. In the static PLA circuit 16a, an N-channel MOS transistor N5 is used as the pull-up device in place of the P-channel transistor P1a in the circuit 16. A feedback circuit portion 18a is formed of inverters G3, G4 and G5 or any odd number of inverters which replace the circuit portion 18 in the circuit 18. The drain of the precharge N-channel MOS transistor N5 is connected to the supply potential VCC, and the source of the transistor N5 is connected to the output node B. The inverter G3 has its input connected to the output node B and its output connected to the input of the inverter G4. The inverter G5 has its input connected to the output of the inverter G4 and its output connected to the gate of the transistor N5. Except for these differences, the circuit 18a operates in the same manner as the circuit 16. Thus, a detailed discussion of its operation will not be repeated. The voltage waveform $V_B$ at the output node B is also shown in FIG. 3 in response to the same input select signal $V_{in}$ making a low-to-high transition.

From the foregoing detailed description, it can thus be seen that the present invention provides an improved static PLA circuit with self-generated precharge for generating a faster high-to-low transition on its output than those traditionally available. This is accomplished in the present invention by a feedback circuit portion formed of inverters connected between the output node of a logic circuit and the gate of a precharge MOS transistor.

While there has been illustrated and described what are at present considered to be preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiments disclosed as the best modes contemplated for carrying out the invention, but that the invention will include all embodiments falling within the scope of the appended claims.

What is claimed is:

1. A static PLA circuit comprising:
   a NOR logic gate having inputs for receiving input select signals and having an output;
   a precharge MOS transistor having one of its main electrodes connected to a supply potential and its other main electrode connected to the output of said NOR gate;
   said percharge MOS transistor being formed of an N-channel transistor;
   a feedback circuit portion formed of inverter means connected between the output of said NOR gate and the gate of said precharge MOS transistor; and
   said inverter means including a first inverter, a second inverter and a third inverter,
   said first inverter having its input connected to the output of said NUR gate and its output connected to the input of said second inverter, said third inverter having its input connected to the output of said second inverter and its output connected to the gate of said N-channel transistor.

2. A static PLA circuit as claimed in claim 1, further comprising a resistor having its one end connected to the supply potential and its other end connected to the output of said NOR gate.

3. A static PLA circuit as claimed in claim 1, wherein said N-channel transistor is delayed in its turn-on time by said first, second and third inverters when the output of said NOR gate is making a high-to-low transition.

4. A static PLA circuit comprising:
   logic gate means having inputs for receiving input select signals and an output;
   a precharge MOS transistor having one of its main electrodes connected to a supply potential and its other main electrode connected to the output of said logic gate means; and
   feedback means connected between the output of said logic gate means and the gate of said precharge MOS transistor for delaying the turn-on time of said MOS transistor when the output of said logic gate means is making a high-to-low transition in response to said input select signals and for delaying the turn-off time of said MOS transistor when the output of said logic gate means is making a low-to-high transition in response to said input select signals.

5. A static PLA circuit as claimed in claim 4, wherein said precharge MOS transistor comprises a p-channel transistor.

6. A static PLA circuit as claimed in claim 4, wherein said precharge MOS transistor comprises an N-channel transistor.

7. A static PLA circuit as claimed in claim 5, wherein said feedback means includes a first inverter and a second inverter, said first inverter having its input connected to the output of said NOR gate and it output connected to the input of said second inverter, said second inverter having its output connected to the gate of said P-channel transistor.

8. A static PLA circuit as claimed in claim 6, wherein said feedback means includes a first inverter, a second inverter and a third inverter, said first inverter having its input connected to the output of said NOR gate and its output connected to the input of said second inverter, said third inverter having its input connected to the output of said second inverter and its output connected to the gate of said N-channel transistor.

9. A static PLA circuit as claimed in claim 7, further comprising a resistor having its one end connected to the supply potential and its other end connected to the output of said NOR gate.

10. A static PLA circuit as claimed in claim 8, further comprising a resistor having its one end connected to the supply potential and its other end connected to the output of said NOR gate.

11. A static PLA circuit as claimed in claim 4, wherein said logic gate means comprises a NOR gate.

12. A static PLA circuit as claimed in claim 11, wherein said NOR gate is formed of at least two N-channel MOS transistors, said N-channel transistors having their drains connected together to form the output of said logic gate means, said N-channel transistors having their sources connected together and to a ground potential, said N-channel transistors having their gates connected to respective ones of said input select signals.

13. A static PLA circuit comprising:
    a NOR logic gate having inputs for receiving input select signals and having an output;
    a precharge MOS transistor having one of its main electrodes connected to a supply potential and its other main electrode connected to the output of said NOR gate;
    said precharge MOS transistor being formed of a P-channel transistor;
    a feedback circuit portion formed of inverter means connected between the output of said NOR gate and the gate of said precharge MOS transistor;
    said inverter means including a first inverter and a second inverter, said first inverter having its input connected to the output of said NOR gate and its output connected to the input of said second inverter, said second inverter having its output connected to the gate of said P-channel transistor; and
    said P-channel transistor being delayed in its turn-on time by said first and second inverters when the output of said NOR gate is making a high-to-low transition.

14. A static PLA circuit as claimed in claim 13, further comprising a resistor having its one end connected to the supply potential and its other end connected to the output of said NOR gate.

* * * * *